United States Patent [19]

Ema

[11] Patent Number: 5,025,294
[45] Date of Patent: Jun. 18, 1991

[54] METAL INSULATOR SEMICONDUCTOR TYPE DYNAMIC RANDOM ACCESS MEMORY DEVICE

[75] Inventor: Taiji Ema, Kawasaki, Japan
[73] Assignee: Fujitsu Limited, Kawasaki, Japan
[21] Appl. No.: 362,222
[22] Filed: Jun. 7, 1989

[30] Foreign Application Priority Data

Jun. 29, 1988 [JP] Japan ................................ 63-162189

[51] Int. Cl.$^5$ ..................... H01L 29/78; H01L 27/02; H01L 29/34
[52] U.S. Cl. .................................. 357/23.6; 357/41; 357/54
[58] Field of Search ...................... 357/41, 23.6, 54, 71

[56] References Cited

U.S. PATENT DOCUMENTS

| | | | |
|---|---|---|---|
| 3,387,286 | 6/1968 | Dennard | 340/173 |
| 4,742,018 | 5/1988 | Kimura et al. | 437/48 |

FOREIGN PATENT DOCUMENTS

| | | | |
|---|---|---|---|
| 0191612 | 8/1986 | European Pat. Off. | |
| 57-201067 | 12/1982 | Japan | 357/23.6 |
| 61-140171 | 6/1986 | Japan | 357/23.6 |
| 61-183955 | 1/1987 | Japan | 357/23.6 |
| 62-155558 | 7/1987 | Japan | 357/23.6 |
| 2143675 | 2/1985 | United Kingdom | |

OTHER PUBLICATIONS

IBM Tech. Bul., 'Self-Aligned Polycide Bi+Line Structure', vol. 30, #12, pp. 109-110, May 88.
Soderman, 'Lay Out of One Device Cell RAM', IBM Tech. Bul., vol. 21, #3, Aug. 78, pp. 1130-1132.
Lee, 'Analysis of Merded Charge Memory Cell', IBM J. of Res Dev., pp. 402-413, Sep. 87.
Richardson, 'Trench Transistor Crosspoint+DRAM Cell', IEDM, pp. 714-717, 5/85.
Smith, Jr., "Vertical One-Device Memory Cell", IBM Technical Disclosure Bulletin, vol. 15, No. 12, May 1973, pp. 3585-3586.
Kruggel, "One-Device Cell Layout", IBM Technical Disclosure Bulletin, vol. 15, No. 2, May 1973, pp. 3751-3752.
Fortino et al., "Field-Effect Device Manufacturing Process", IBM Technical Disclosure Bulletin, vol. 20, No. 11A, Apr. 1978, pp. 4286-4287.
Mano et al., "Circuit Techniques for a VLSI Memory", IEEE Journal of Solid-State Circuits, vol. SC-18, No. 5, Oct. 1983, pp. 463-470.
Barson et al., "High Density Single-Device Memory Cell", IBM Technical Disclosure Bulletin, vol. 16, No. 6, Nov. 1973, p. 1698.

*Primary Examiner*—Jerome Jackson, Jr.
*Assistant Examiner*—Stephen D. Meier
*Attorney, Agent, or Firm*—Staas & Halsey

[57] ABSTRACT

A dynamic random access memory device includes a substrate, a plurality of pairs of sources and drains of transistors formed in the substrate and located within an area defined by field oxidation films formed on the substrate. Gate electrodes are formed on gate oxidation films formed on the substrate and located between the pairs of sources and drains. The gate electrodes extend in a first direction perpendicular to the direction of a channel formed between the paired source and drain. A plurality of word lines are formed on the field oxidation films and extend in a second direction identical to the direction of the channel. The word lines are integrally formed with the gate electrodes. A plurality of bit lines are formed in the substrate and include the sources as portions thereof. The bit lines extend in the first direction perpendicular to the direction of the channel. An insulating film covers the word lines and the gate electrodes, and includes contact holes. A plurality of storage capacitors each make connect with related one of the drains through related one of the contact holes formed in the insulating film. Each of the storage capacitors includes a storage electrode extending above related one of the gate electrodes, related one of the word lines and the field oxidation films, a dielectric film surrounding the storage electrode, and an opposed electrode so as to cover the dielectric film.

23 Claims, 15 Drawing Sheets

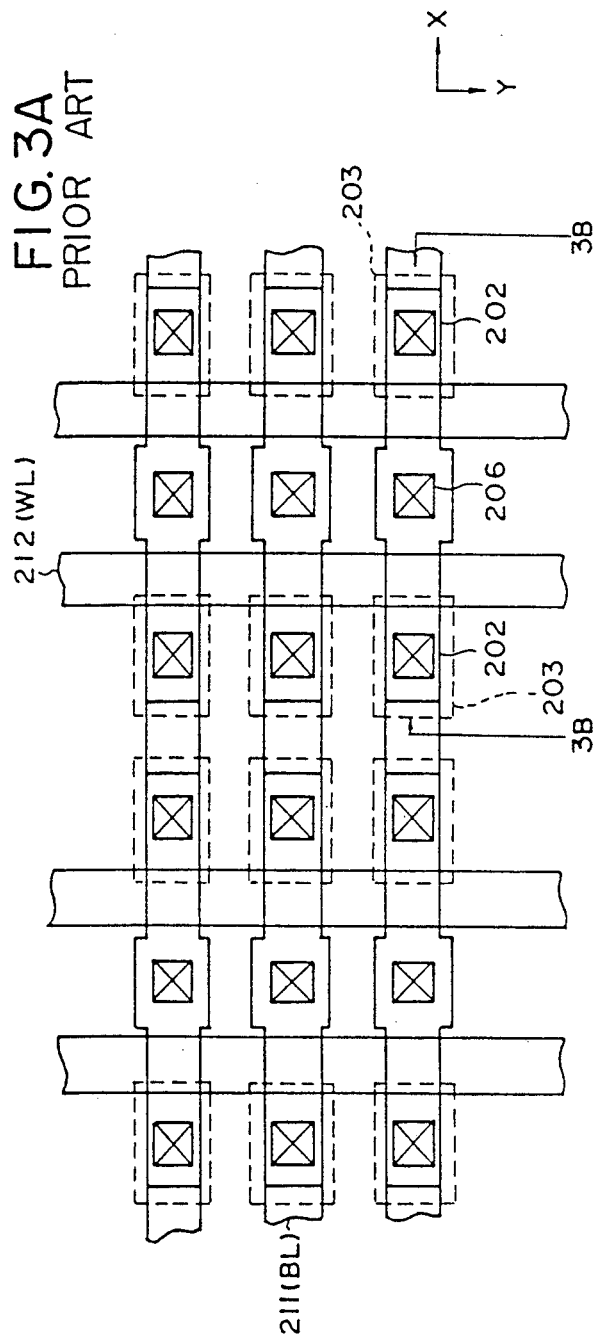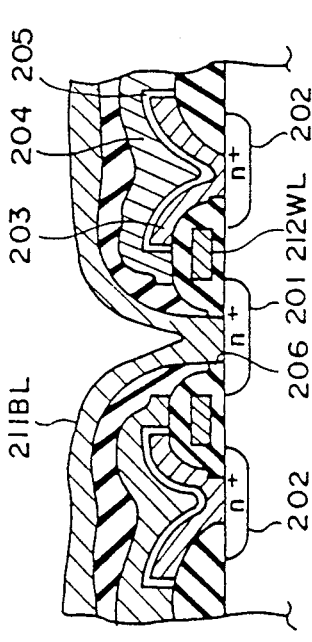

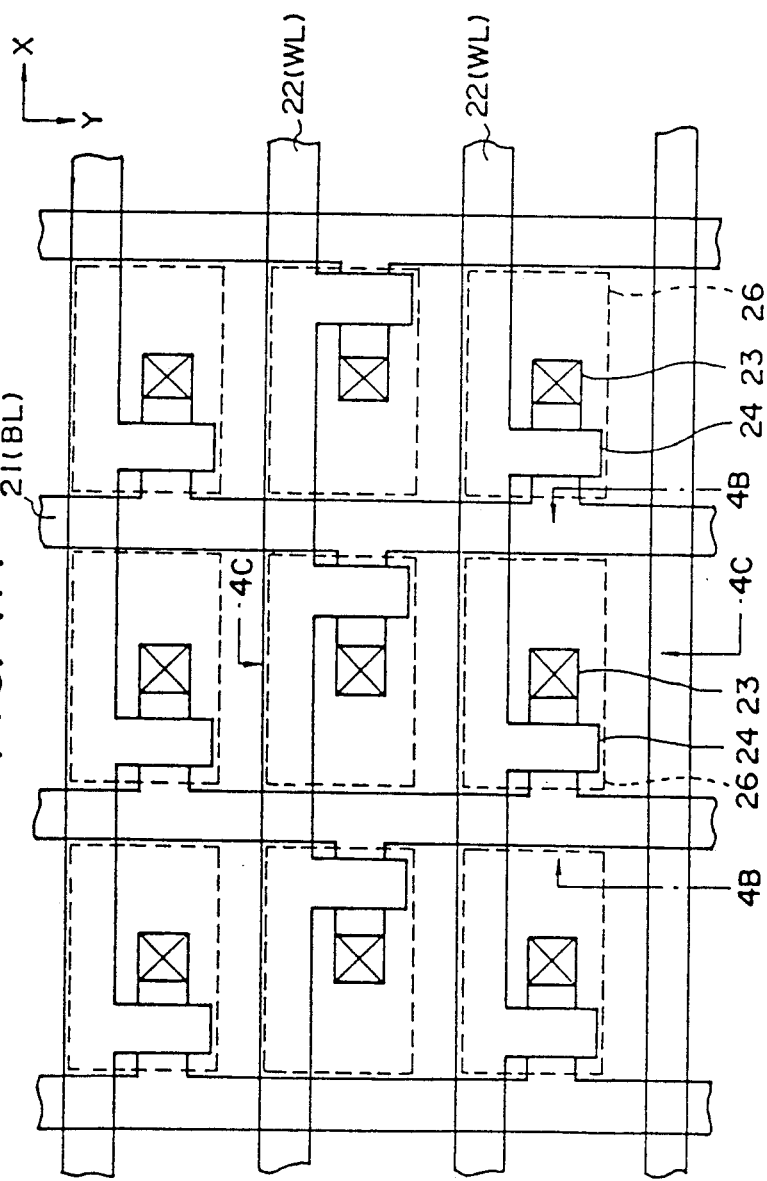

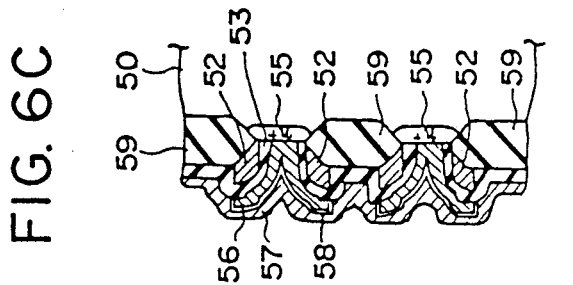
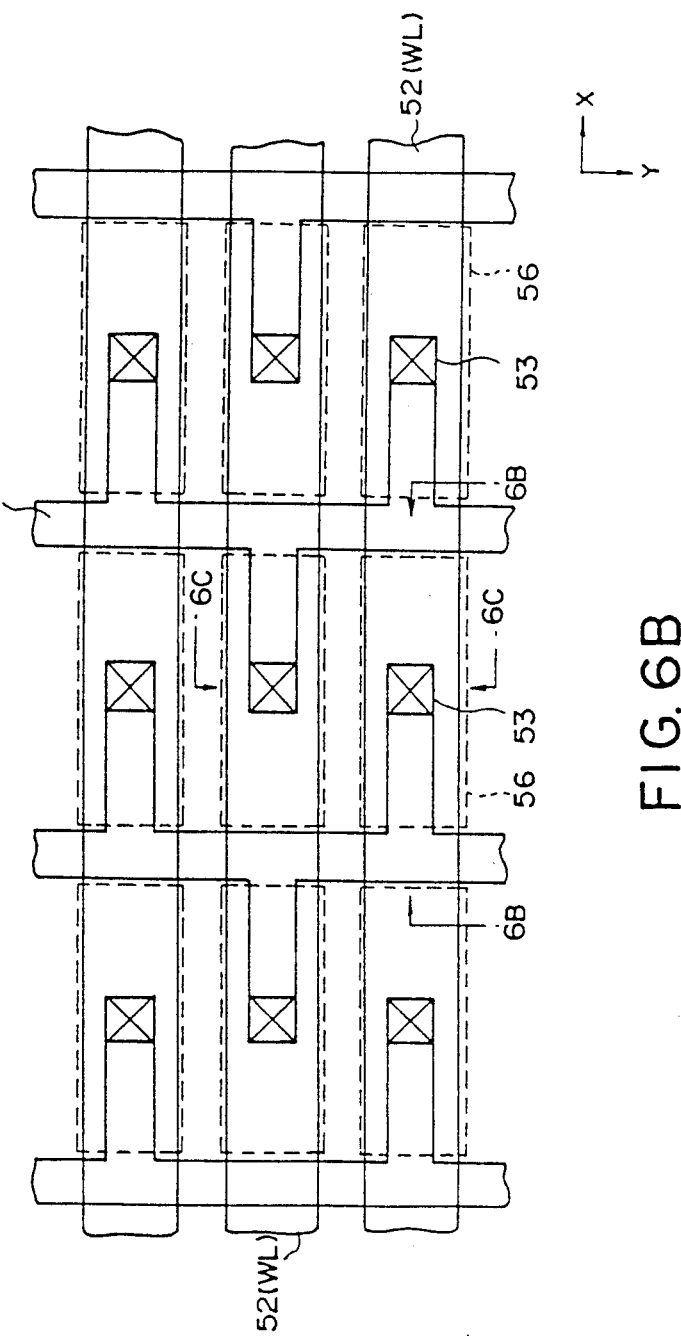
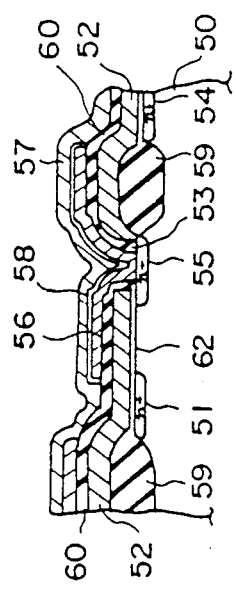

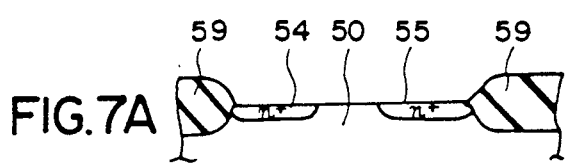 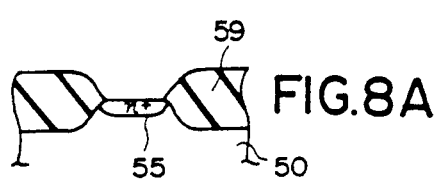
FIG.7A　　　　　　　　　　　　FIG.8A
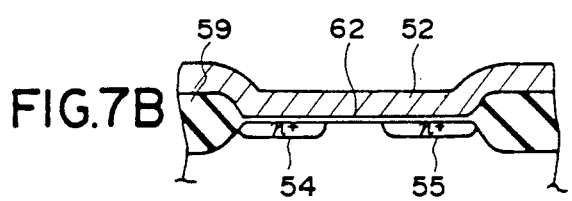 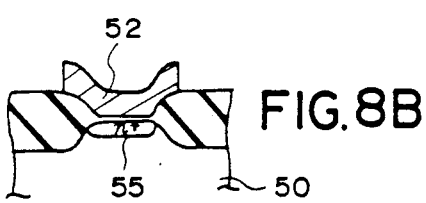
FIG.7B　　　　　　　　　　　　FIG.8B
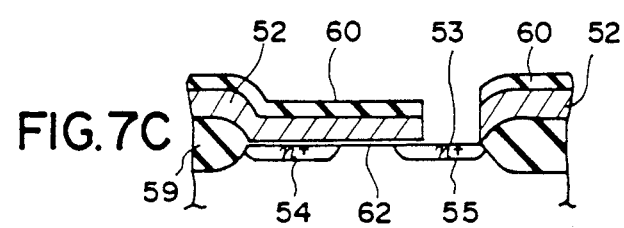 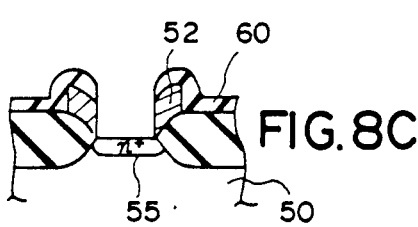
FIG.7C　　　　　　　　　　　　FIG.8C
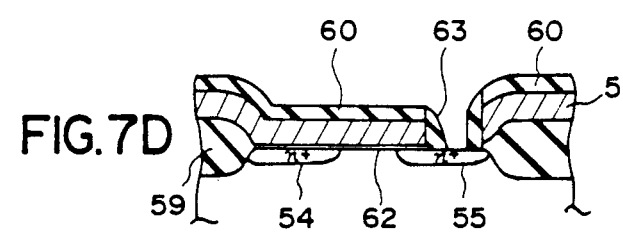 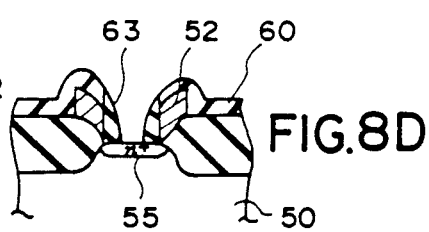
FIG.7D　　　　　　　　　　　　FIG.8D
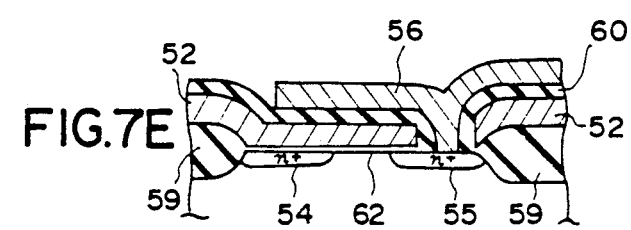 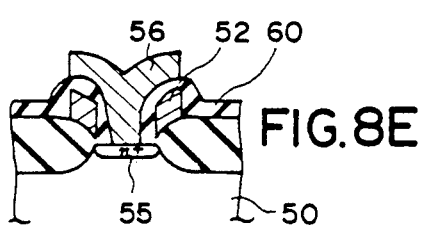
FIG.7E　　　　　　　　　　　　FIG.8E

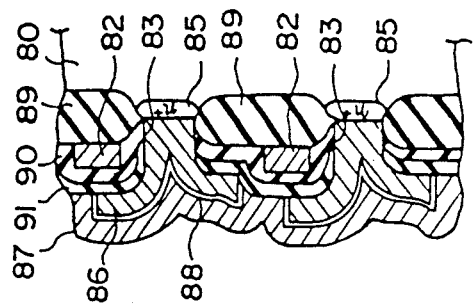
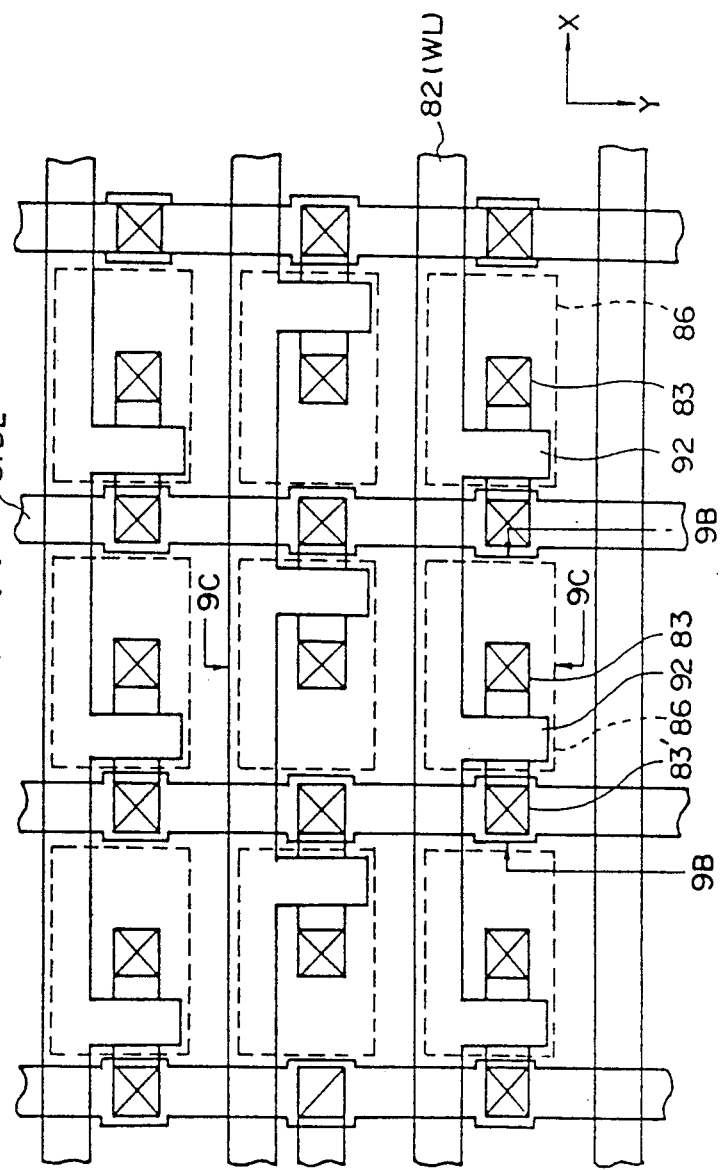
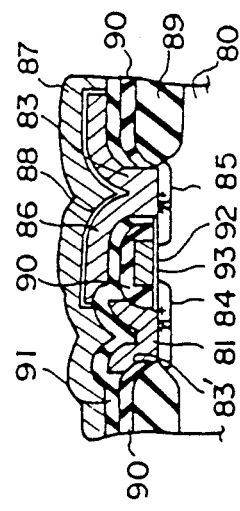

FIG. 14

|  | S/A PITCH (μ) | WL PITCH (μ) | CELL AREA (μ) | STORAGE ELECTRODE AREA (μ) | RATIO (%) |
|---|---|---|---|---|---|
| CONVENTIONAL OPEN BIT LINE | 3.7 | 3.3 | 12.21 | 5.55 | 45.5 |
| 1ST EMBODYMENT | 3.85 | 2.85 | 10.97 | 6.77 | 61.7 |
| 2ND EMBODYMENT | 3.7 | 2.0 | 7.4 | 3.9 | 52.7 |
| 3RD EMBODYMENT | 4.0 | 2.85 | 11.4 | 7.095 | 62.2 |
| 4TH EMBODYMENT | 3.7 | 2.0 | 7.4 | 3.9 | 52.7 |
| CONVENTIONAL FOLDED BIT LINE | 4.0 | 2.075 | 8.3 | 3.51 | 42.2 |

P(S/A) = 4a+b+c+2d , P(WL) = 3a+b+c
S = (3a+b+c+2d)(2a+b+c)

P(S/A) = 4a+2b+2d , P(WL) = 2(a+b)
S = (3a+2b+2d)(a+2b)

$P(S/A) = 4a + 2c + 2d$, $P(WL) = 3a + b + c$
$S = (3a + 2c + 2d)(2a + b + c)$ $P(S/A) = 4a + 2b + 2d$, $P(WL) = 2(a + b)$
$S = (3a + 2b + 2d)(a + 2b)$ $P(S/A) = 4(a+b)$, $P(WL) = \frac{1}{2}(4a+3c)$ $S = (a+2b)(3a+2c-b)$ $P(S/A) = 2(a+b) \rightarrow 4a+2c$ (S/A LAYOUT)

$P(WL) = 3a+b+2c$ $S = (3a+2c)(2a+c)$

METAL INSULATOR SEMICONDUCTOR TYPE DYNAMIC RANDOM ACCESS MEMORY DEVICE

BACKGROUND OF THE INVENTION

The present invention generally relates to a metal insulator semiconductor type memory device, and particularly to a metal insulator semiconductor type dynamic random access memory device having stacked capacitor type memory cells. More particularly, the present invention relates to improvement in the structure and layout (arrangement) of memory cells.

A one-transistor one-capacitor type memory cell is widely used as a memory cell of a metal insulator semiconductor type dynamic random access memory (hereafter simply referred to as a MIS type DRAM or just DRAM). Currently, a 1-Mbit DRAM and a 4-Mbit DRAM are available. It is required to reduce the cell size per one bit to achieve the integration density equal to or more than 1 Mbits. A trench type memory cell and a stacked capacitor type memory cell have been proposed in order to reduce the cell size per one bit. A trench type memory cell is a cell in which a capacitor, which is a structural element of a memory cell, is formed in a silicon substrate. A stacked capacitor type memory cell is a cell in which a capacitor is formed above a silicon substrate.

Referring to FIG. 1, there is illustrated the structure of a conventional DRAM. The illustrated DRAM includes a memory cell array 1, which is made up of a plurality of memory cells arranged in a matrix form. The DRAM includes an address buffer 2, a row decoder 3, a column decoder 4, a sense amplifier 5, and a data output buffer 6. Those elements form peripheral circuits of the memory cell array 1. In the illustrated DRAM, it is not reasonable that we try to enhance the integration density of the illustrated DRAM at the sacrifice of electrical characteristics of memory cells. Similarly, it is not reasonable that we try to improve electrical characteristics of memory cells at the sacrifice of the integration density. This means that we should research and develop DRAM devices by taking account of not only the memory cell array 1 but also the peripheral circuits such as the row decoder 3, column decoder 4 and the sense amplifier 5.

FIGS. 2A and 2B illustrate equivalent circuits each showing the connection between the sense amplifier 5 and the memory cell array 1. FIG. 2A relates to the folded bit line type, and FIG. 2B relates to the open bit line type. In FIGS. 2A and 2B, MC is a memory cell formed in the memory cell array 1, and S/A is a sense amplifier which is formed in the sense amplifier 5 and is provided for each of pairs of bit lines BL and $\overline{BL}$. As shown, bit lines BL ($\overline{BL}$) and word lines WL in conventional MIS type DRAMs are arranged so as to form a mesh. One memory cell MC is provided at an intersection of one bit line BL ($\overline{BL}$) and one word line WL. The folded bit line type DRAM has a pair of bit lines BL and $\overline{BL}$ which are folded at one related sense amplifier S/A and extend in parallel. The open bit line type DRAM has a pair of bit lines BL and $\overline{BL}$ which extend in opposite directions from one related sense amplifier S/A.

Generally, the sense amplifier S/A includes two transistors forming a flip-flop with respect to a pair of bit lines BL and $\overline{BL}$. On the other hand, the row decoder 3 includes one transistor for one word line WL. Therefore, the size of the sense amplifier 5 is necessarily large than the size of the row decoder 3, and thus the design of the sense amplifier 5 is complicated. The bit line pitch (the distance between adjacent bit lines) must match the sense amplifier pitch, with which the sense amplifiers S/A are arranged. Such matching is achieved in the folded bit line type with ease, as compared with the open bit line type. This will be seen from FIG. 2A. That is, one sense amplifier S/A is arranged in the distance between the bit lines BL1 and BL2 ($\overline{BL1}$ and $\overline{BL2}$).

On the other hand, in the open bit line type, one sense amplifier S/A must be positioned within one pitch of bit lines. Therefore, it becomes difficult to form one sense amplifier S/A within one pitch of bit lines as the size of the memory cells MC are reduced. This means that the bit line pitch must be selected based on the size of the sense amplifiers S/A. In other words, the size of DRAM devices greatly depends on the size of the sense amplifiers S/A (not the size of memory cells MC). If it becomes possible to match the sense amplifier pitch and the bit line pitch without increasing the entire size of the memory cell array 1, an increased integration density can be obtained. This also provide a higher freedom in design of peripheral circuits.

The inventor knows some proposals for overcoming the above-mentioned problems. For example, the following paper discloses an improved open bit line type memory cell configuration: M. Koyanagi et al. "Novel High Density Stacked Capacitor MOS RAM", Japn. J. Appl. Phys. Vol. 18 (1979), Supplement 18-1, PP. 35-42. FIG. 3A is a plan view of a memory cell configuration disclosed in the above-mentioned paper, and FIG. 3B is an elevational view taken along the lines 3B—3B in FIG. 3A. The memory cell includes sources 201, drains 202, storage electrodes 203, opposed electrodes 204, insulating (dielectric) films 205, contact holes 206, bit lines 211, and word lines 212. The illustrated structure employs the stacked capacitor type memory cells. Although the proposed structure provides a field effect transistor (FET) of a reduced size, it is too small to match the sense amplifier pitch and the bit line pitch. In other words, the element density of a memory device greatly depends on the size of the sense amplifiers, as compared with the size of the memory cells.

Another improvement has been proposed in Japanese Laid-Open Patent Application No. 61-183955. This proposal intends to enhance the integration density by providing the arrangement (layout) of peripheral circuits with an improvement. In the proposal, bit lines extending in opposite directions from a sense amplifier are arranged in an interdigital arrangement. With this arrangement, the sense amplifier pitch is doubled. However, an increased density of memory cells is not expected.

Generally, it is desired that the capacitance value of a capacitor of a memory cell is as large as possible. This is because a large cell capacitance stabilizes the operation of a memory cell and provides increased immunity to soft errors. For these reasons, it is desired to efficiently and effectively utilize an area assigned to a memory cell. However, in the configuration of FIG. 3B, bit lines 211 are formed after forming storage electrodes 203. This makes it difficult to efficiently and effectively utilize the area assigned to memory cells.

SUMMARY OF THE INVENTION

It is therefore a general object of the present invention to provide an improved metal insulator semiconductor type dynamic random access memory device in which the aforementioned disadvantages are eliminated.

A more specific object of the present invention is to provide a metal insulator semiconductor type dynamic random access memory device in which the bit line pitch is increased without increasing the size of a memory cell array, and the bit line pitch and the sense amplifier pitch matches each other.

The above objects of the present invention can be achieved by a dynamic random access memory device comprising a substrate; a plurality of paris of sources and drains of transistors formed in the substrate and located within an area defined by field oxidation films formed on the substrate, the transistors being arrayed in the form of a matrix; gate electrodes formed on gate oxidation films formed on the substrate and located between the pairs of sources and drains, the gate electrodes extending in a first direction perpendicular to the direction of a channel formed between the paired source and drain; a plurality of word lines formed on the field oxidation films and extending in a second direction identical to the direction of the channel, the word lines being integrally formed with the gate electrodes; a plurality of bit lines formed in the substrate and including the sources as portions thereof, the bit lines extending in the first direction perpendicular to the direction of the channel; an insulating film covering the word lines and the gate electrodes and including contact holes; and a plurality of storage capacitors each making connect with related one of the drains through related one of the contact holes formed in the insulating film, each of the storage capacitors including a storage electrode extending above related one of the gate electrodes, related one of the word lines and the field oxidation films, a dielectric film surrounding the storage electrode, and an opposed electrode so as to cover the dielectric film.

The above-mentioned objects of the present invention can also be achieved by a dynamic random access memory device comprising a substrate; a plurality of paris of sources and drains of transistors formed in the substrate and located within an area defined by field oxidation films formed on the substrate, the transistors being arrayed in the form of a matrix; a plurality of word lines formed on the field oxidation films and gate oxidation films formed on the substrate, the word lines extending in a first direction identical to the direction of a channel formed between the paired source and drain and extending above the sources and drains covered by the gate oxidation films, the word lines having contact holes through which the drains are exposed, the word lines being served as gate electrodes of the transistors; an insulating film covering the word lines and a sidewall of each of the contact holes and partially covering the drains exposed through the contact holes; a plurality of bit lines formed in the substrate and including the sources as portions thereof, the bit lines extending in a second direction perpendicular to the direction of the channel and the first direction; and a plurality of storage capacitors each making connect with related one of the drains through related one of the contact holes formed in the insulating film, each of the storage capacitors including a storage electrode extending above the word lines, and the field oxidation films, a dielectric film surrounding the storage electrode, and an opposed electrode so as to cover the dielectric film.

The above-mentioned objects of the present invention can also be achieved by a dynamic random access memory device comprising a substrate; a plurality of paris of sources and drains of transistors formed in the substrate and located within an area defined by field oxidation films formed on the substrate, the transistors being arrayed in the form of a matrix; gate electrodes formed on gate oxidation films formed on the substrate and located between the pairs of sources and drains, the gate electrodes extending in a first direction perpendicular to the direction of a channel formed between the paired source and drain; a plurality of word lines formed on the field oxidation films and extending in a second direction identical to the direction of the channel, the word lines being integrally formed with the gate electrodes; an insulating film covering the word lines and gate electrodes and including first and second contact holes; a plurality of bit lines formed on the insulating film and making contact with the sources through the first contact holes formed in the insulating film, the bit lines extending in the first direction perpendicular to the direction of the channel; and a plurality of storage capacitors each making connect with related one of the drains through the second contact hole formed in the insulating film, each of the storage capacitors including a storage electrode extending above related one of the gate electrodes, related one of the word lines and the field oxidation films, a dielectric film surrounding the storage electrode, and an opposed electrode so as to cover the dielectric film.

The aforementioned objects of the present invention can also be achieved by a dynamic random access memory device comprising a substrate; a plurality of paris of sources and drains of transistors formed in the substrate and located within an area defined by field oxidation films formed on the substrate, the transistors being arrayed in the form of a matrix; a plurality of word lines formed the field oxidation films and gate oxidation films formed on the substrate, the word lines extending in a first direction identical to the direction of a channel formed between the paired source and drain and extending above the sources and drains covered by the gate oxidation films, the word lines having first and second contact holes, the drains being exposed through the related first contact holes, the word lines being served as gate electrodes of the transistors; an insulating film covering the word lines and a sidewall of each of the first and second contact holes and partially covering the drains and sources exposed through the first and second contact holes; a plurality of bit lines formed on the insulating film and making contact with related sources through the second contact holes formed in the insulating films, the bit lines extending in a second direction perpendicular to the direction of the channel and the first direction; and a plurality of storage capacitors each making connect with related one of the drains through related one of the first contact holes formed in the insulating film, each of the storage capacitors including a storage electrode extending above related one of the word lines and the field oxidation films, a dielectric film surrounding the storage electrode, and an opposed electrode so as to cover the dielectric film.

Other objects, features and advantages of the present invention will become apparent from the following detailed description when read in conjunction with the accompanying drawings.

BRIEF DESCRIPTION OF THE DRAWINGS

FIG. 3A is a plan view of a conventional DRAM;

FIG. 3B is a sectional view taken along lines 3B—3B shown in FIG. 3A;

FIG. 4A is a plan view of a first embodiment of the present invention;

FIGS. 4B and 4C are sectional views taken along lines 4B—4B and 4C—4C shown in FIG. 4A, respectively;

FIG. 6A is a plan view of a second embodiment of the present invention;

FIGS. 6B and 6C are sectional views taken along lines 6B—6B and 6C—6C shown in FIG. 6A;

FIGS. 7A through 7E are sectional views taken along the lines 6B—6B shown in FIG. 6A observed at different manufacturing steps;

FIGS. 8A through 8E are sectional views taken along the lines 6C—6C shown in FIG. 6A observed at different manufacturing steps;

FIG. 9A is a plan view of a third embodiment of the present invention;

FIG. 9B is a sectional view taken along lines 9B—9B shown in FIG. 9A;

FIG. 9C is a sectional view taken along lines 9C—9C shown in FIG. 9A;

FIG. 14 is a view illustrating parameter values in the first through fourth embodiments, and conventional open bit line and folded bit line types;

DESCRIPTION OF THE PREFERRED EMBODIMENTS

Figure 1:
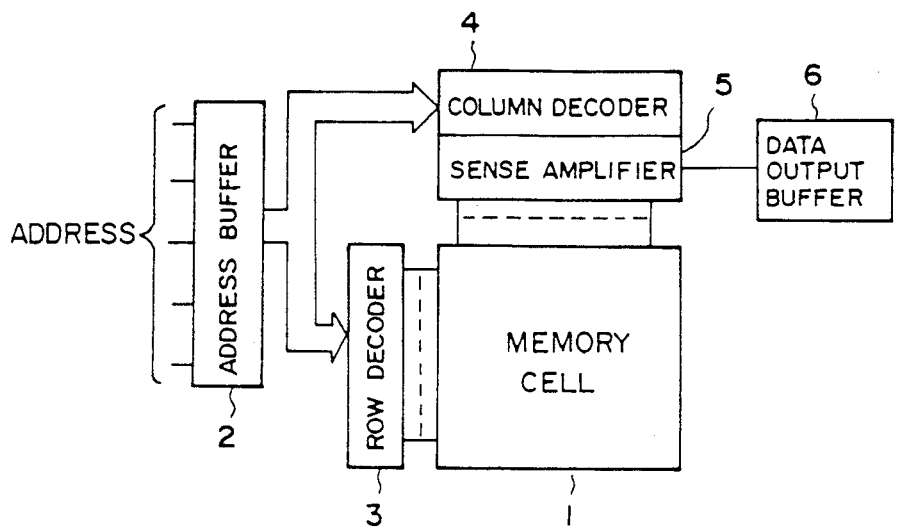
FIG. 1 is a schematic block diagram of a dynamic random access memory (DRAM)
Figure 2A:
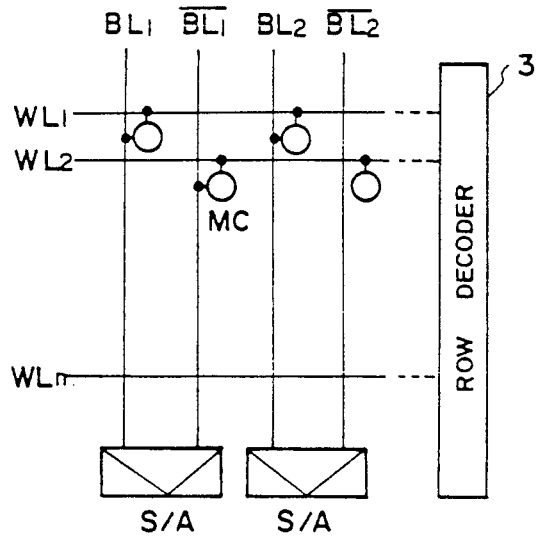
FIGS. 2A and 2B are views illustrating available connections between sense amplifiers and bit lines.
Figure 2B:
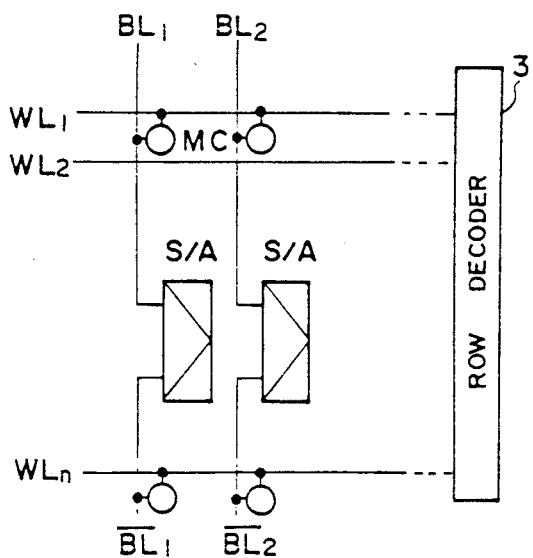

A description is given of a first preferred embodiment of the present invention with reference to FIGS. 4A through 4C. The illustrated DRAM device includes a semiconductor substrate 11 such as a p-type silicon substrate, bit lines (BL) 21, word lines (WL) 22, contact holes 23, gates 24, drains 25, storage electrodes 26, an opposed electrode 27, insulating layers 28, field oxidation layers 29, and insulating films 30. As will be described later, the bit lines 21 partially include sources. The channel of a transistor in the first embodiment extends in the same direction (X direction) as that in the conventional DRAM device shown in FIGS. 3A and 3B. However, the first embodiment is definitely distinguished from the conventional DRAM device shown in FIGS. 3A and 3B in the following. That is, the bit lines 21 of the first embodiment extend in the Y direction and the word lines 22 extend in the X direction. That is, the bit lines 21 extend in the direction perpendicular to the direction of the channel of a transistor, and the word lines 22 extend in the same direction as the channel. On the other hand, the bit lines BL of the conventional DRAM device extend in the X direction, and the word lines WL extend in the Y direction. According to the first embodiment, the bit line pitch is larger than the word line pitch. As a result of this arrangement, it is possible to match the bit lines 21 and the arrangement of peripheral circuits such as a sense amplifier.

Essential features of the first embodiment in addition to the above-mentioned feature are as follows. First, in FIG. 4A, opposed ends of each of the storage electrodes 26 extend up to the vicinity of the bit lines 21. This means that the storage electrode 26 utilizes the cell area efficiently and effectively. Secondly, as is clearly shown in FIG. 4B, the bit lines 21 are formed in the semiconductor substrate 11. That is, the bit lines 21 are formed by buried layers. Further, the bit lines 21 have portions which function as sources of transistors for transferring data. Each of the bit lines 21 is connected in alternating sequence to the sources of the transistors arranged on the opposite sides of the respective bit line 21. The drains 25 are formed at the same time as the sources or bit lines 21. The gates 24 are formed on a gate oxidation film 32 provided on the semiconductor substrate 11. The gates 24 and the word lines 22 are integrally formed of a conductive material such as impurity-doped polysilicon, or conductive polysilicon. The gates 24 extend in the Y direction from the word lines 22. The storage electrodes 26 are electrically coupled to the corresponding drains 25. The storage electrodes 26 form storage (stacked) capacitors together with the insulating films 28 and the opposed electrode 27, which covers the entire device surface. The field oxidation films 29 define element regions (active regions). The insulating layers 30 electrically separate the storage electrodes 26 from the gate electrodes 22 and the active regions. It is noted that in FIG. 3B, the bit line 21 formed above the storage electrodes 203 has an elevational portion which makes contact with the source 201. Therefore, it is impossible to greatly spread a wing of the storage electrode 203 above the transfer transistor. On the other hand, the bit lines 21 are formed in the substrate, and therefore it is possible to greatly extend the storage electrodes 26 up to the vicinity of the bit lines 21. Therefore, the cell area measured in the X-Y plane is efficiently and effectively utilized with less wasteful area. This presents an increased capacitance value of the storage capacitor, and greatly contributes to the stabilization of the DRAM memory operation and an improvement on immunity to soft errors. Sense amplifiers (not shown) are arranged in the X direction.

A description is given of a method for producing the above-mentioned DRAM device with reference to FIGS. 5A through 5E. It is noted that materials and dimensions described below are just examples and may be replaced with different materials and dimensions known by those skilled in the semiconductor field. FIGS. 5A through 5E relate to sectional views along the lines 4B—4B observed at different manufacturing steps.

Figure 5A:
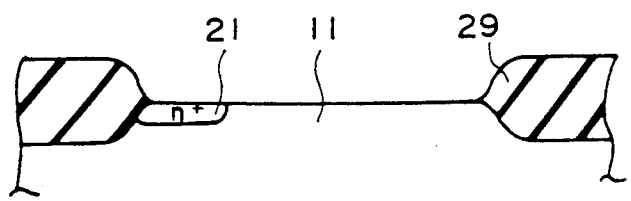
FIGS. 5A through 5E are sectional views taken along the lines 4B—4B shown in FIG. 4A observed at different manufacturing steps.

Referring to FIG. 5A, the field oxidation films 29 made of silicon dioxide ($SiO_2$) are formed on the p-type silicon substrate 11 by a conventional selective oxidation process. Then, an n+-type layer serving as a bit line 21 is formed in the silicon substrate 11 by a selective ion injection process in which arsenic (As) ions are introduced with a dose of $4 \times 10^{15}$ cm$^{-2}$ and an injection energy of 60 keV. It is noted that the bit line 21 extends in the Y direction and includes a portion serving as a source. Of course, a conventional mask process and photolithography process are carried out for forming the bit lines 21.

Figure 5B:
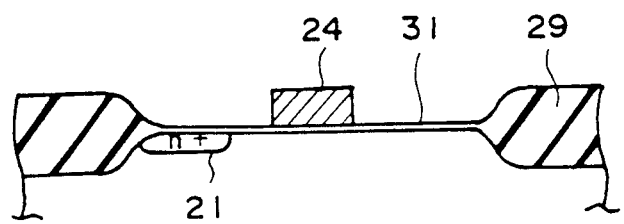

Next, as shown in FIG. 5B, the gate oxidation film 31 is formed on the silicon substrate 11 by a conventional thermal oxidation process. Thereafter, by a chemical vapor deposition (CVD) process, a polysilicon layer is deposited to a thickness of 1000 angstroms, and subsequently a tungsten silicide (WSi) layer is deposited to a thickness of 1500 angstroms. Then two stacked layers are patterned by a photolithography process to thereby form the word lines 22 which extend in the X direction, and the gate electrodes 24 extend in the Y direction.

Figure 5C:
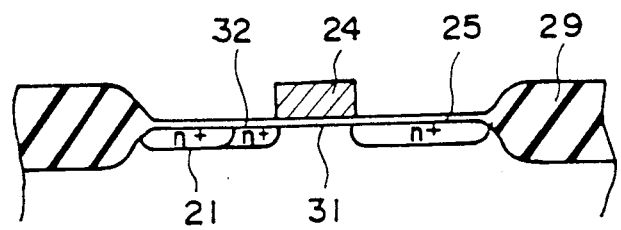

Then, as shown in FIG. 5C, the source 21 and drain 25 are formed in the silicon substrate 11 by a selective ion injection process in which arsenic ions are introduced into the silicon substrate 11 with a dose of $1 \times 10^{15}$ cm$^{-2}$ and an acceleration voltage of 60 keV. In this ion injection process, an n+-type layer 32 is formed, which is a part of the source including the n+-type layer 21. It is noted the source 21 and drain 25 are self-aligned with respect to the gate 24. The impurity density values of the source 21 and drain 25 are lower than the impurity density of the gate 24.

Figure 5D:
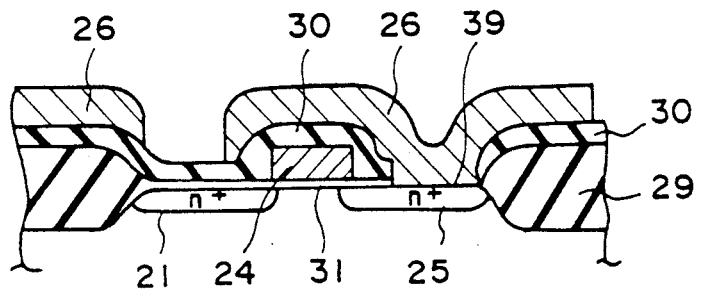

Thereafter, as shown in FIG. 5D, the insulating film 30 having a thickness of 1000 angstroms is formed on the entire surface of the silicon substrate 11 by the CVD process, and is then subjected to a patterning process. Thereafter, by a reactive etching process, a contact hole 39 is formed in the insulating film 30 and the gate oxidation film 31 so that the drain 25 is partially exposed. Then, a polysilicon film is deposited to a thickness of 1000 angstroms by the CVD process, and is then subjected to a selective ion injection process in which arsenic ions are introduced therein with a dose of $1 \times 10^{15}$ cm$^{-2}$ and an r acceleration voltage of 50 keV. Thereby, the polysilicon film is provided with the n+-type conductivity. Thereafter, the storage electrodes 26 are formed from the polysilicon film by the photolithography process.

Figure 5E:
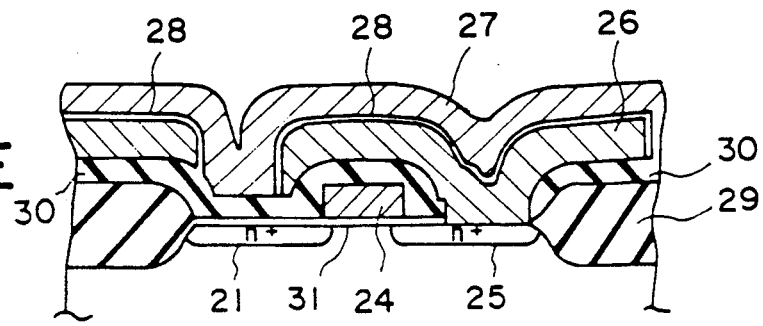

After that, as shown in FIG. 5E, the exposed surface of the storage electrodes 26 are subjected to a thermal oxidation process so that an insulating film (dielectric film) 28 of a thickness of 100 angstroms is deposited on the exposed surface of each of the storage electrodes 26. Then, a polysilicon film is deposited to a thickness of 1000 angstroms by the CVD process. Then, phosphorus oxychloride ($POCl_3$) is thermally diffused into the above-mentioned polysilicon film. Thereby, the opposed electrode 27 is formed. It is noted that the patterning process is not required to form the opposed electrode 27. Finally, a well-known process is carried out in order to complete an element and prevent the surface of the device from being activated, such as by the deposition of a passivation film, for example.

A description is given of a second embodiment of the present invention with reference to FIGS. 6A through 6C. Bit lines 51 are impurity-diffused layers formed in a semiconductor substrate 50 such as a p-type silicon substrate, and has portions serving as sources of transistors. Word lines 52 are impurity-diffused layers formed in the semiconductor substrate 50. The word lines 52 have portions serving as gates of transistors, and are formed above the transistors.

It can be seen from FIGS. 6B and 6C that the word lines 52 are electrically insulated from the source and drain region 57 and 55 and from the substrate 50 by gate oxidation films 62 and field oxidation films 59. Top surfaces of the word lines 52 are covered by an insulating film 60. Contact holes 53 are formed in each of the word lines 52 so as to partially expose drains 55. The sidewall of each of the contact holes 53 is covered with the insulating film 60. A storage electrode 56 is provided in the contact hole 53, and makes contact with the related drain 55. As is shown in FIG. 6C, since each word line 52 is wider than the diameter of each contact hole 53, the word line 52 is prevented from electrically being disconnected even after forming the contact holes 53. Storage electrodes 56 are provided on the insulating film 60 and are spread to the maximum of the permitted cell area. The storage electrodes 56 form capacitors together with insulating films 58 and an opposed electrode 58.

The second embodiment has the following features. First, the storage electrodes 56 are self-aligned with respect to the word lines 52 and make contact with the related drains 55. Secondly, the word lines 52 extending in the X direction are laid above the transistors for transferring data. With this arrangement, the word line pitch can be further reduced as compared with the first embodiment. Correspondingly, it becomes possible to further reduce the area of each memory cell and increase the element density. The width of each of the word lines 52 is almost the same as that of each of the storage electrodes 56. Moreover, it should be appreciated that in addition to the above-mentioned features, the second embodiment has the essential feature of the first embodiment that the bit line pitch is larger than the word line pitch. Thereby, the memory cells of the second embodiment match the peripheral circuits. It is noted that in the first embodiment, the word lines 22 are not located above the transfer transistors but arranged between the transistors.

A description is given of a method of producing the second embodiment with reference to FIGS. 7A through 7E and FIGS. 8A through 8E. FIGS. 7A through 7E are sectional views which are taken along the lines 6B—6B shown in FIG. 6A and are observed at different manufacturing steps. FIGS. 8A through 8E are sectional views which are taken along the lines 6C—6C shown in FIG. 6A and are observed at different manufacturing steps.

Referring to FIGS. 7A and 8A, the field oxidation films 59 are formed on the p-type silicon substrate 50. Then, an n+-type diffusion layer 54 serving as a bit line and including as portions thereof the sources, and n+-type diffusion layers 55 serving as drains 55 are formed in the silicon substrate 50 by the selective ion injection process.

Next, as shown in FIGS. 7B and 8B, a gate oxidation film 62 is formed on the silicon substrate 50 by thermal oxidation Subsequently, the word line 52, which also serves as a gate electrode, is formed.

Then, as shown in FIGS. 7C and 8C, a silicon dioxide film 60 is deposited and is then etched by the reactive ion etching process so as to form the contact hole 53, which penetrates the silicon dioxide film 60 and the gate oxidation film 62.

Thereafter, in FIGS. 7D and 8D, a thermal oxidation film having a thickness of 200 angstroms is formed on the exposed surface of the drain 53 and the entire surface of the silicon substrate 50. Further, an oxidation film made of silicon dioxide is deposited to a thickness of 1000 angstroms by the CVD process. Thereafter, the latter oxidation film is subjected to reactive ion etching. Thereby, an oxidation film 63 is left around the sidewall of the contact hole 53. In the following description, the oxidation films 60 and 63 are simply referred to as the oxidation film 60.

Then, as shown in FIGS. 7E and 8E, the storage electrode 56 is formed in the same way as the storage electrode 26 of the first embodiment. Thereafter, the dielectric film 58 and the opposed electrode 58 are sequentially formed as in the case of the first embodiment.

A description is given of a third embodiment of the present invention with reference to FIGS. 9A through 9C. The third embodiment includes a p-type silicon substrate 80, bit lines 81, word lines 82, sources 84, drains 85, and gate electrodes 92. The drains 85 are electrically coupled with related storage electrodes 86 through related contact holes 83, and form storage capacitors together with dielectric films 88 and an opposed electrode 87. Reference numerals 88, 89, 90 and 91 indicate insulating films.

The third embodiment has an essential feature that the bit lines 81 are formed by conductive films laid on the insulating film 90, and are in contact with the related sources 81. The arrangement of the bit lines 81 contributes to a decrease of the area of a p-n junction formed in the semiconductor substrate 80, as compared with the first and second embodiments, and therefore α particles, inducing soft errors, can effectively be suppressed.

A description is given of a method of manufacturing the third embodiment with reference to FIGS. 10A through 10F illustrating cross sections, which are observed at different manufacturing steps.

Figure 10A:
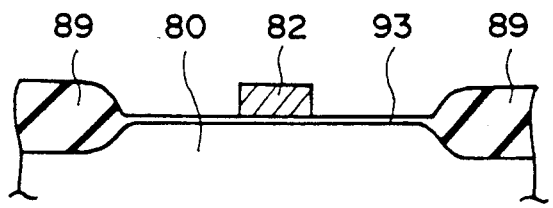
FIGS. 10A through 10F are sectional views taken along the lines 9B—9B shown in FIG. 9A observed at different manufacturing steps.

Referring to FIG. 10A, field insulation films 89 are formed on the p-type silicon substrate 80, and then a gate oxidation film 93 is formed thereon. Thereafter, by the same process as that shown in FIG. 5B, the word lines 82 and gate electrodes 92 are formed on the field oxidation films 89 and the gate oxidation films 93. A portion of the word line 82 also serves as the gate electrode 92.

Figure 10B:
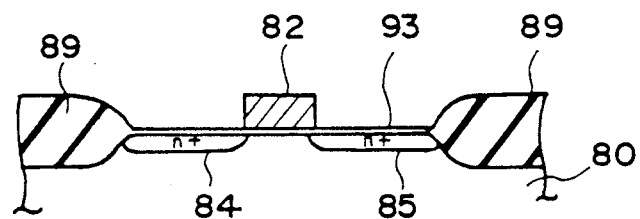
Figure 10C:
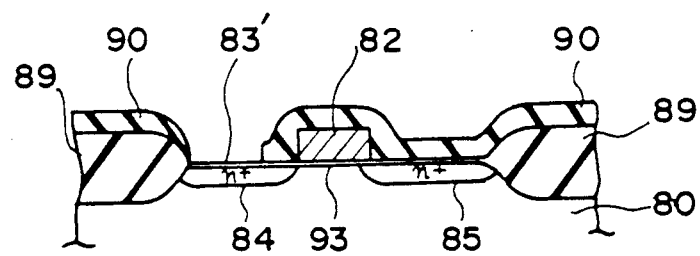

Next, as shown in FIG. 10B, the source 84 and drain 85 are formed in the silicon substrate 80 by the selective ion injection process. Then, as shown in FIG. 10C, the silicon oxidation film 90 is formed on the entire surface, and a contact hole 83' is formed in the silicon dioxide film 90 and the gate oxidation film 93 so that the source 84 is partially exposed.

Figure 10D:
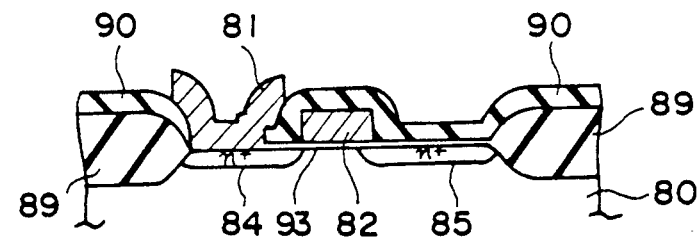

Thereafter, in FIG. 10D, a conductive polysilicon layer of a thickness of 500 angstroms is deposited on the entire surface, and then a tungsten silicide (WSi) layer of a thickness of 1500 angstroms is deposited thereon. Then, the stacked layers are patterned so as to form the bit line 81.

Figure 10E:
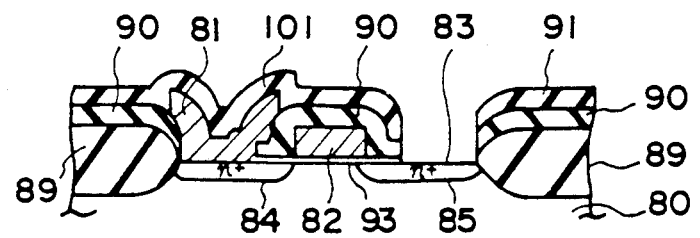
Figure 10F:
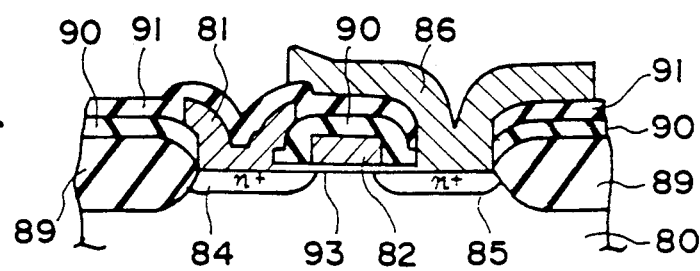

Then, as shown in FIG. 10E, the insulating film 91 made of silicon dioxide is deposited to a thickness of 1000 angstroms by CVD. Subsequently, the contact hole 83 is formed so as to penetrate the insulating films 91, 90 and the gate oxidation film 93 so that the drain 85 is partially exposed through the contact hole 83. Thereafter, as shown in FIG. 10F, the storage electrode 86 is formed by CVD and photolithography. The following steps are the same as those used in a conventional method.

The word lines 82 of the third embodiment extend in the X direction between neighboring transistors arranged in the Y direction. Alternatively, it is possible to arrange the word lines 82 so as to extend above the transistors in the same way as the word lines 52 of the second embodiment. The third embodiment presents the almost the same advantages as the second embodiment in addition to the above-mentioned feature.

Figure 11A:
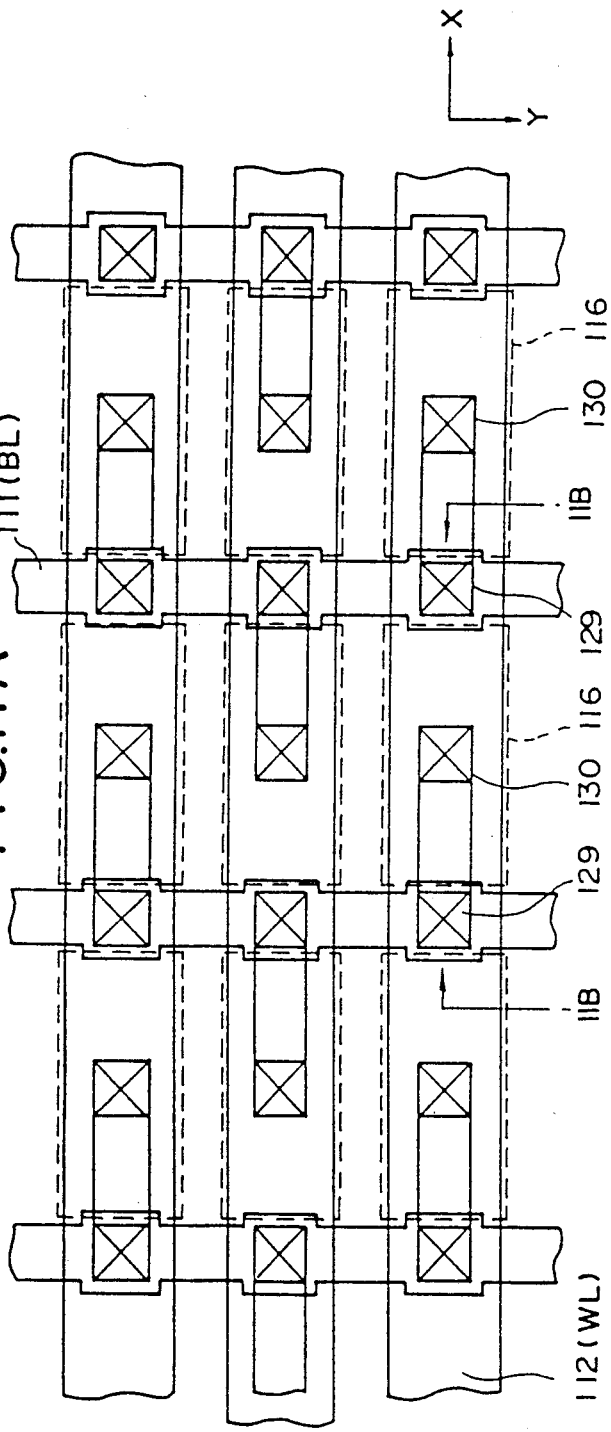
FIG. 11A is a plan view of a fourth embodiment of the present invention.
Figure 11B:
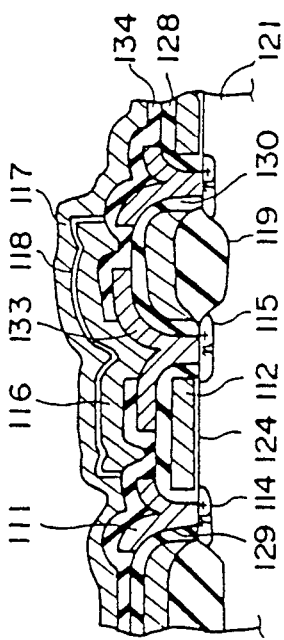
FIG. 11B is a sectional view taken along lines 11B—11B shown in FIG. 11A.

A description is given of a fourth embodiment of the present invention with reference to FIGS. 7A and 7B. The fourth embodiment is distinguished from the third embodiment in that bit lines and storage electrodes of the fourth embodiment are self-aligned with respect to word lines, and are in contact with sources and drains of transistors, respectively. As is illustrated in FIGS. 11A and 11B, the fourth embodiment includes a semiconductor substrate 121 such as a p-type silicon substrate, bit lines 111, word lines 112, contact holes 113, sources 114, drains 115, storage electrodes 116, an opposed electrode 117, insulating layers 118, field oxidation layers 119, and a storage electrode leading layer 133. The bit lines 111 extend in the Y direction, and the word lines 112 extend in the X direction and are laid above transistors. Therefore, the bit lines 111 and the word lines 112 match the peripheral circuits, such as a sense amplifier and a row decoder. The bit lines 111 are in contact with related sources 114 through contact holes 129. The remaining portions of the bit lines 111 are laid on an insulating layer 128, which covers the word lines 112. The above-mentioned structure of the bit lines 111 is the same as that of the bit lines 81 of the third embodiment. Therefore, α particles inducing soft errors can effectively be suppressed. Each of the storage electrode 116 makes contact with the related storage electrode leading layer 133. Opposed ends of the storage electrode 116 extend up to ends of the bit lines 111. The width of each of the word lines 112 is almost the same as that of each of the storage electrodes 116. Therefore, the cell area is effectively and efficiently utilized.

A description is given of a method of producing the fourth embodiment with reference to FIGS. 12A through 12G, which illustrate cross sections taken along the lines 11B—11B shown in FIG. 11A, as observed at different manufacturing steps.

Figure 12A:
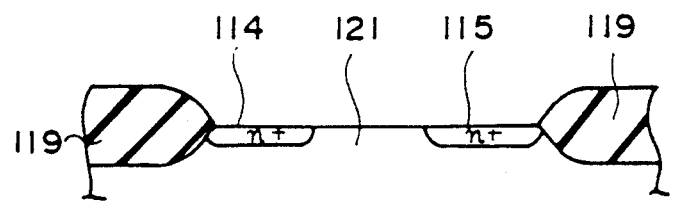
FIG. 12A through 12G are sectional views taken along the lines 11B—11B shown in FIG. 11A observed at different manufacturing steps.

Referring to FIG. 12A, the field oxidation layers 119 are formed on the silicon substrate 121 by the conventional selective oxidation process. Then, the source 114 and the drain 115 are formed in the silicon substrate 121 by the selective ion injection process. The source 114 and drain 115 are formed by n+-type impurity diffused layers.

Figure 12B:
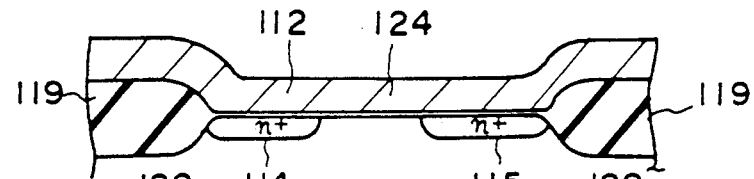
Figure 12C:
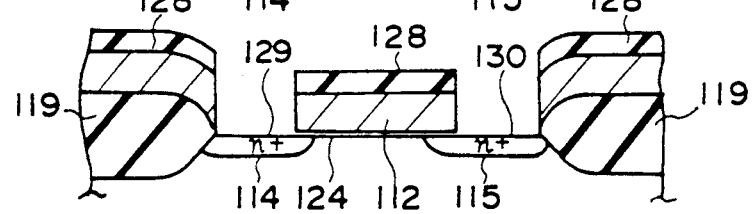

Then, as shown in FIG. 12B, a gate oxidation film 124 is formed in the thermal oxidation process. Thereafter, the word lines 112 which are also served as gate electrodes, are formed. In FIG. 12C, the insulating film 128 such as a silicon dicxide film is deposited to a thickness of 1000 angstroms by CVD. Then the contact holes 129 and 130 are formed so as to penetrate the insulating film 128, the word line 112 and the gate oxidation film 124 so that the source 114 and drain 115 are partially exposed through the contact holes 129 and 130, respectively. Alternatively, the source 114 and drain 115 may be formed by introducing impurities through the contact holes 129 and 130. In this case, the production step of FIG. 12A is not carried out.

Figure 12D:
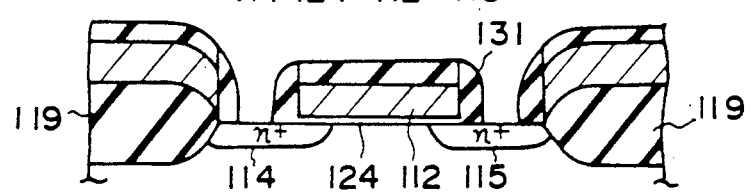

Then, as shown in FIG. 12D, a thermal oxidation film of a thickness of 200 angstroms is deposited on the exposed surface of the source and drain 114 and 115 as well as the entire device surface. Subsequently, an oxidation film is deposited to a thickness of 1000 angstroms by the CVD process. Thereafter, the stacked oxidation films are subjected to reactive ion etching. Thereby, an oxidation film 131 is formed which covers a sidewall forming each of the contact holes 129 and 130, and a part of each of the source 114 and drain 115.

Figure 12E:
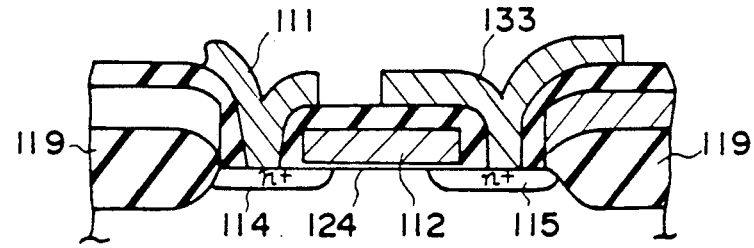
Figure 12F:
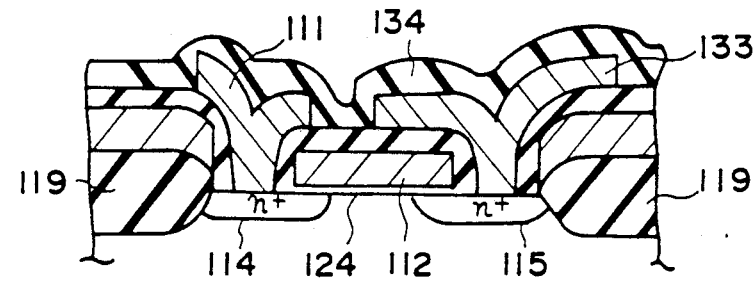
Figure 12G:
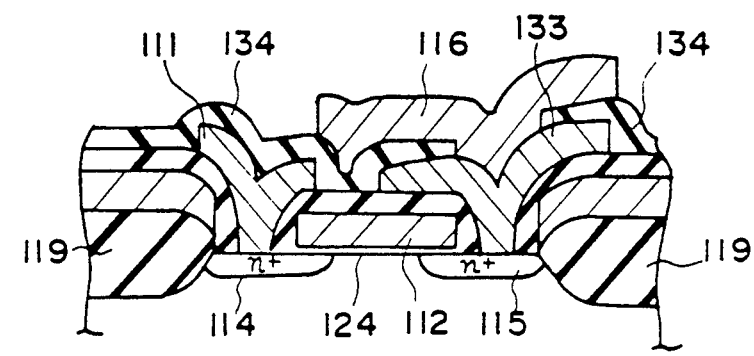

In FIG. 12E, in the same way as the step of FIGS. 7D and 8D, the bit line 111 and the storage electrode leading layer 133 are self-aligned with respect to the word line 112 by CVD so as to make contact with the source 114 and the drain 115, respectively. In FIG. 12F, an insulating layer 134 formed by an oxidation layer is formed on the entire surface of the device by CVD. Thereafter, a contact hole 141 is formed in the insulating layer 134 in the same way as the step of FIGS. 7D, 7E, 8D and 8E. Then, a polysilicon film is grown by CVD, and is then patterned so as to form the storage electrode 116. Then, a dielectric film is formed around the exposed surface of the storage electrode 116 by the thermal oxidation process. Finally, the opposed electrode 117 is formed so as to cover the entire surface of the device.

Figure 13A:
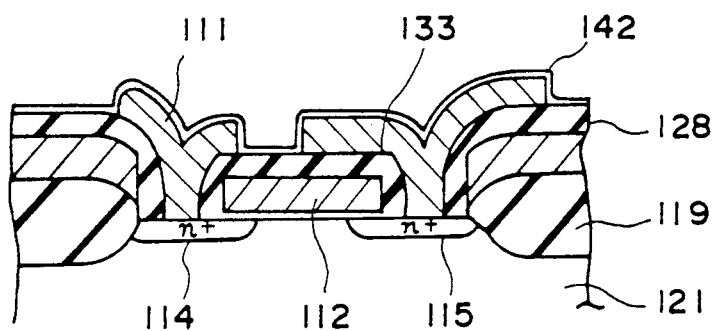
FIGS. 13A and 13B are sectional views illustrating alternative manufacturing steps in the process shown in FIGS. 12A through 12G.
Figure 13B:
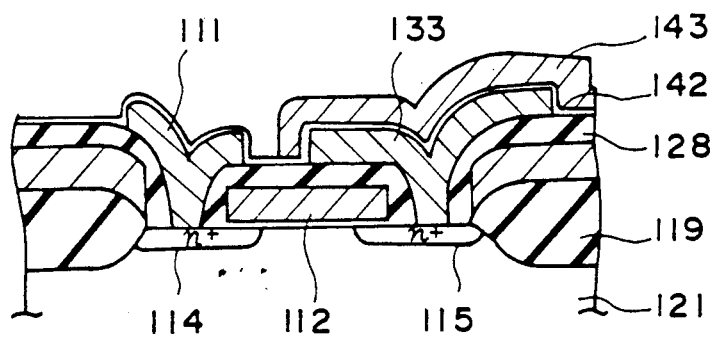

Alternatively, as shown in FIG. 13A, a dielectric film 142 is formed on the entire surface by the thermal oxidation process, after performing the step of FIG. 12E. In this case, the storage electrode leading layer 133 is served as a storage electrode itself. Then, a polysilicon film is grown on the entire surface, and is then patterned so as to form an opposed electrode 143.

FIG. 14 illustrates respective examples of the sense amplifier pitch, word line pitch, cell area and the ratio of the storage electrode area to the cell area with respect to devices which are fabricated based on the first through fourth embodiments of the present invention, and the conventional open bit line type. Parameter values for the conventional folded bit line type are illustrated for reference. It can be seen from FIG. 14 that in each of the first through fourth embodiments, the sense amplifier pitch is larger than the word line pitch, and therefore the bit lines match the peripheral circuits. It is noted that the sense amplifier pitch obtained in the conventional open bit line type is a little larger than the word line pitch. This is because the bit line pitch is set larger in order to match the minimum size of sense amplifier which is obtainable with production precision currently available.

In the first embodiment, although the sense amplifier pitch and the storage electrode area are larger than those in the conventional open bit line type, the utility efficiency of the cell area is enhanced. As a result, the cell area formed in the first embodiment is smaller than that for the conventional open bit line type.

In the second and fourth embodiments, the cell area is approximately half that of the conventional type; nevertheless it becomes possible to obtain the same sense amplifier pitch as that of the conventional type. Additionally, the cell area obtained in the second and fourth embodiments is smaller than that of the conventional folded line type; nevertheless the utility efficiency of cell area is high. Therefore, the storage electrode area is larger than the folded bit line type. This means a large amount of capacitance is obtained when the sense amplifier pitch is set approximately equal to that of folded bit line type.

In the third embodiment, the utility efficiency of cell area is the highest. Further, the cell amplifier pitch and the storage electrode area are larger than those of the conventional open bit line type, and the cell area is smaller than that of the conventional type. Moreover, when the sense amplifier pitch in the third embodiment is set approximately equal to that of the conventional folded bit line type, the storage electrode area can be doubled.

The parameter values shown in FIG. 14 are obtained as follows. FIGS. 15A through 15D are partially enlarged views which two-dimensionally illustrate the structure of respective cells of the first through fourth embodiments of the present invention, respectively. FIGS. 15E and 15F are partially enlarged views which two-dimensionally illustrate the structure of respective cells of the conventional folded bit line type and the open bit line type, respectively. In these figures, an area surrounded by a broken line is a storage electrode. Also in FIGS. 15A through 15F, 'a' is the minimum pattern width available in photolithography, 'b' is a margin defined by taking account of positional errors which may occur when depositing a mask film, 'c' is a margin defined by taking account of shortcircuits which may occur in a conductive layer, and 'd' is a bird's peak which may occur in a selective oxidation process.

In each of FIGS. 15A through 15F, there are written the sense amplifier pitch [p(S/A)], word line pitch [p(WL)], and the storage electrode area (s). In FIG. 15F, the sense amplifier pitch p(S/A) is set equal to 4a+2c, which is the minimum size. The values shown in FIG. 14 are obtained assuming that a=0.7 μm, b=0.3 μm, c=0.45 μm and d=0.15 μm.

Figure 15A:
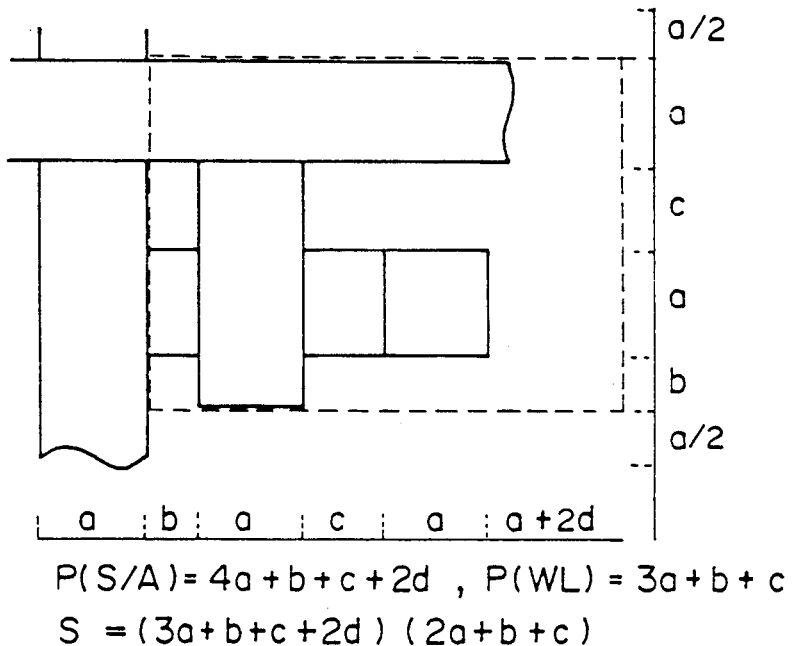
FIG. 15A is an enlarged schematic plan view illustrating dimensions of a memory cell used in the first embodiment of the present invention.
Figure 15B:
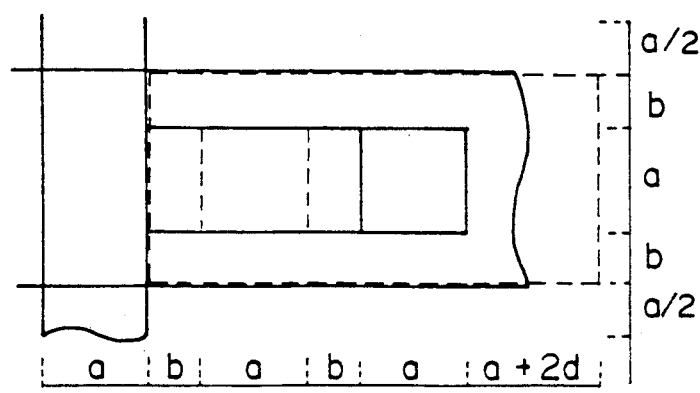
FIG. 15B is an enlarged schematic plan view illustrating dimensions of a memory cell used in the second embodiment of the present invention.
Figure 15C:
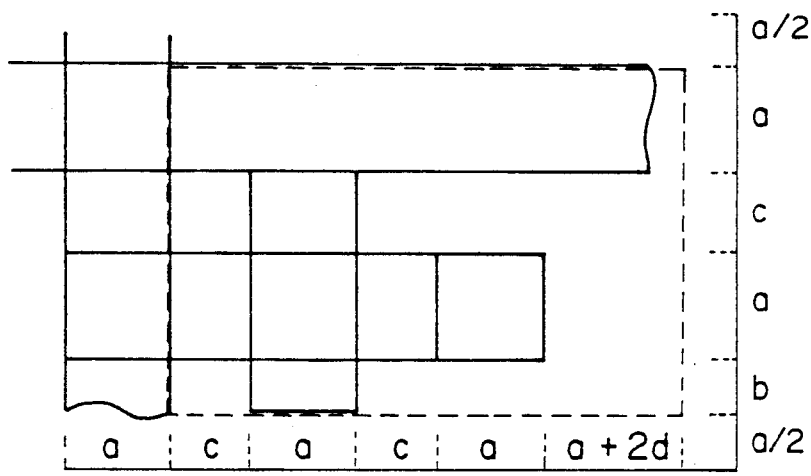
FIG. 15C is an enlarged schematic plan view illustrating dimensions of a memory cell used in the third embodiment of the present invention.
Figure 15D:
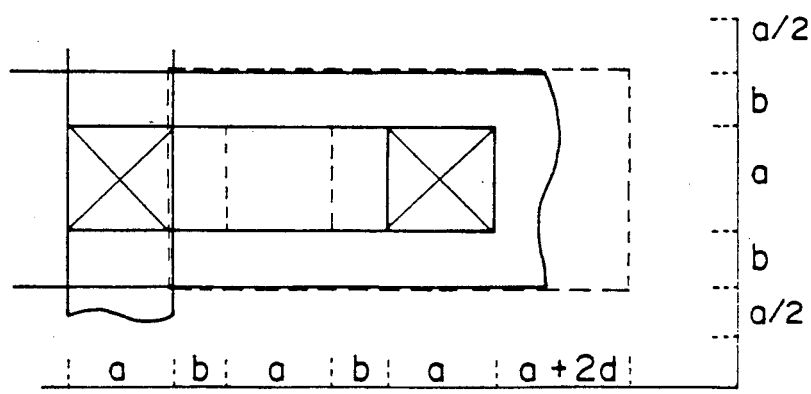
FIG. 15D is an enlarged schematic plan view illustrating dimensions of a memory cell used in the fourth embodiment of the present invention.
Figure 15E:
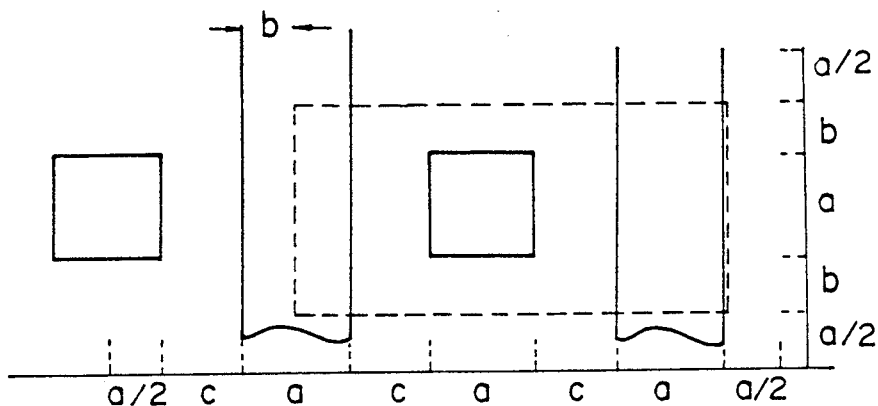
FIG. 15E is an enlarged schematic plan view illustrating dimensions of a memory cell used in a conventional folded bit line type.
Figure 15F:
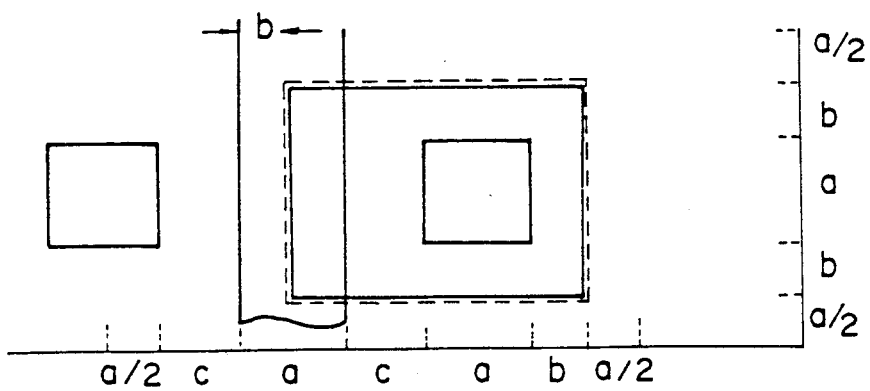
FIG. 15F is an enlarged schematic plan view illustrating dimensions of a memory cell used in a conventional open bit line type.

In FIG. 15A, the sense amplifier pitch p(S/A) is equal to 4a+b+c+2d, the word line pitch p(WL) is equal to 3a+b+c, and the storage electrode area (s) is equal to (3a+b+c+2d)(2a+b+c). In FIG. 15B, the sense amplifier pitch p(S/A) is equal to 4a +2b+2d, the word line pitch p(WL) is equal to 2(a+b), and the storage electrode area (s) is equal to (3a+2b+2d)(a+2b). In FIG. 15C, the sense amplifier pitch p(S/A) is equal to 4a+2c+2d, the word line pitch p(WL) is equal to 3a+b+c, and the storage electrode area (s) is equal to (3a+2c+2d)(2a+b+c). In FIG. 15D, the sense amplifier pitch p(S/A) is equal to 4a+2b+2d, the word line pitch p(WL) is equal to 2(a+b), and the storage electrode area (s) is equal to (3a+2b+2d)(a+2b). In FIG. 15E, the sense amplifier pitch p(S/A) is equal to 4(a+b), the word line pitch p(WL) is equal to (4a+3c)/2, and the storage electrode area (s) is equal to (a+2b)(3a+2c−b). In FIG. 15F, the sense amplifier pitch p(S/A) is equal to 2(a+b) to 4a+2c depending on layout of sense amplifier, the word line pitch p(WL) is equal to $3a+b+2c$, and the storage electrode area (s) is equal to $(3a+2c)(2a+c)$.

The present invention is not limited to the aforementioned embodiments, and variations and modifications may be made without departing from the scope of the present invention. For example, in the first through fourth embodiments, one bit line is alternately coupled to sources arranged on both sides thereof. Alternatively, one bit line may be coupled to sources arrange on the same side thereof. Transistors in each of the first through fourth embodiments, are n-channel field effect transistors. Alternatively, p-channel transistors can be formed in the same way.

What is claimed is:

1. A dynamic random access memory device comprising:
   a substrate having a main surface;
   a field oxide film formed on the main surface of the substrate and patterned to define a matrix array of plural exposed areas of the substrate main surface;
   a matrix array of plural transistors respectively formed in said exposed areas of said substrate, said plural transistors and respective, plural exposed areas being aligned in corresponding, parallel sets in each of mutually traverse, first and second directions parallel to the main surface of the substrate, and each transistor comprising a pair of associated source and drain regions, spaced apart within said respective area and defining a channel therebetween extending in the first direction;
   plural bit lines formed in said substrate and extending in parallel relationship in the second direction, each said bit line being associated with a respective set of transistors aligned in said second direction and said source regions thereof comprising portions of said associated bit line;
   gate oxidation films formed on said exposed areas of said main surface of said substrate and covering the respective, said associated source and drain regions;
   plural word lines formed on said field oxidation and gate oxidation films and extending in parallel relationship in the first direction, each said word line being associated with a respective set of transistors aligned in the first direction and being disposed above and separated by the corresponding gate oxidation films from the respective, associated sources and drains of the associated, aligned set of transistors and serving in common as the respective gate electrodes thereof;
   plural contact holes respectively associated with said plural drain regions and extending through the respective said word lines and gate oxidation films in a third direction, transverse to the main surface of the substrate, each contact hole having corresponding sidewalls and being aligned with and exposing at least a portion of a respectively associated drain region;
   an insulating film formed on and covering said word lines and said transverse sidewalls of each of said contact holes and partially covering the surfaces of said drain regions exposed through said respective contact holes; and
   plural storage capacitors respectively associated with said plural transistors, each storage capacitor comprising a storage electrode, formed on said insulating film and spaced thereby from the associated word line, extending in correspondence with, and above, the associated transistor and adjacent field oxide film, each said storage capacitor extending through the corresponding contact hole and contacting the drain region of the respectively associated transistor, a dielectric film formed on said storage electrode, a dielectric film formed on said storage electrode, and an opposed electrode formed on said dielectric film.

2. A dynamic random access memory device as claimed in claim 1, wherein said word lines are wider than said contact holes.

3. A dynamic random access memory device as claimed in claim 1, wherein each of said storage capacitors is of almost the same width as each of said word lines.

4. A dynamic random access memory device as claimed in claim 1, wherein said insulating film includes a reactive ion etched portion which covers said sidewalls of each of said contact holes.

5. A dynamic random access memory device as claimed in claim 1, wherein each said storage electrode comprises a self-aligned storage electrode which is in contact with said respective drain region.

6. A dynamic random access memory device as claimed in claim 1, further comprising plural sense amplifiers, each for amplifying the potential difference between a pair of related bit lines respectively associated therewith, out of said plurality of bit lines, said plural sense amplifiers being disposed in successive positions, displaced in said first direction and aligned in said second direction with said respectively associated pair of bit lines.

7. A dynamic random access memory device as claimed in claim 1, wherein the distance between two adjacent, parallel bit lines is larger than the distance between two adjacent, parallel word lines.

8. A dynamic random access memory device as claimed in claim 1, wherein each said bit line is disposed between and respectively associated with a pair of first and second adjacent sets of plural transistors aligned in said second direction, the respective source regions of an alternating sequence of each said pair of first and second adjacent sets of plural transistors comprising portions of said respectively associated bit line disposed therebetween.

9. A dynamic random access memory device comprising:
   a substrate having a main surface;
   a field oxide film formed on the main surface of the substrate and patterned to define a matrix array of plural exposed areas of the substrate main surface;
   A matrix array of plural transistors respectively formed in said exposed areas of said substrate, said plural transistors and respective, plural exposed areas being aligned in corresponding, parallel sets in each of mutually transverse, first and second directions parallel to the main surface of the substrate, and each said transistor comprising a pair of associated source and drain regions, spaced apart within said respective area and defining a channel therebetween extending in the first direction;
   gate oxidation films formed on said exposed areas of said main surface of said substrate and covering the respective, said associated source and drain regions;
   plural word lines formed on said field oxidation and gate oxidation films and extending in parallel relationship in the first direction, each said work line being associated with a respective set of transistors aligned in the first direction and integral portions thereof comprising the respective gate electrodes of the respectively associated, aligned set of transistors;

a first insulating film formed on said substrate and covering at least said source and drain regions and said word lines and integral gate electrode portions thereof;

plural, first contact holes, respectively associated with said plural source regions, extending through said first insulating and gate oxidation films in a third direction, transverse to the main surface of the substrate, each first contact hole being aligned with and exposing at least a portion of the respectively associated source region;

plural bit lines formed on said first insulating film and extending in parallel relationship in the second direction, each said bit line being associated with a respective set of transistors aligned in said second direction, each bit line extending through the corresponding contact holes and contacting the source regions of the respectively associated set of transistors aligned in said second direction;

a second insulating film formed on and covering at least said bit lines;

plural, second contact holes, respectively associated with said plural drain regions, each extending through said insulating and gate oxidation films in a third direction, transverse to the main surface of the substrate, in alignment with and exposing at least a portion of the respectively associated drain region; and plural storage capacitors respectively associated with said plural transistors, each storage capacitor comprising a storage electrode, formed on said first and second insulating films and spaced thereby from the word line and gate electrode portion thereof and extending in correspondence with, and above, the associated transistor and adjacent field oxide film, each said storage capacitor extending through the associated second contact hole and contacting the associated drain of the respective transistor, a dielectric film formed on said storage electrode, and an opposed electrode formed on said dielectric film.

10. A dynamic random access memory device as claimed in claim 9, wherein each said word line is disposed between, and respectively associated with one of, a pair of first and second adjacent sets of plural transistors aligned in said first direction.

11. A dynamic random access memory device as claimed in claim 9, wherein each of said bit lines is disposed between and respectively associated with a pair of first and second adjacent sets of plural transistors aligned in said second direction, the respective source regions of an alternating sequence of said pair of first and second adjacent sets of plural transistors being contacted by said respectively associated bit line disposed therebetween.

12. A dynamic random access memory device as claimed in claim 9, further comprising plural sense amplifiers, each for amplifying the potential difference between a pair of related bit lines respectively associated therewith, out of said plurality of bit lines, said plural sense amplifiers being disposed in successive positions, displaced in said first direction and aligned in said second direction with said respectively associated pair of bit lines.

13. A dynamic random access memory device as claimed in claim 9, wherein the distance between two adjacent, parallel bit lines is larger than the distance between two adjacent, parallel word lines.

14. A dynamic random access memory device comprising:

a substrate having a main surface;

a field oxide film formed on the main surface of the substrate and patterned to define a matrix array of plural exposed areas of the substrate main surface;

a matrix array of plural transistors respectively formed in said exposed areas of said substrate, said plural transistors and respective, plural exposed areas being aligned in corresponding, parallel sets in each of mutually transverse, first and second directions parallel to the main surface of the substrate, and each transistor comprising a pair of associated source and drain regions, spaced apart within said respective area and defining a channel therebetween extending in the first direction;

gate oxidation films formed on said exposed areas of said main surface of said substrate and covering the respective, said associated source and drain regions;

plural word lines formed on said field oxidation and gate oxidation films and extending in parallel relationship in the first direction, each said word line being associated with a respective set of transistors aligned in the first direction and disposed above and separated by the corresponding gate oxidation films from the respective, associated sources and drains of the associated, aligned set of transistors and serving in common as the gate electrodes thereof;

plural first contact holes, respectively associated with said plural drain regions, and plural second contact holes, respectively associated with said plural source regions, extending through said word lines and gate oxidation films in a third direction, transverse to the main surface of the substrate, and having corresponding sidewalls, said first and second contact holes being aligned with and exposing at least a portion of the respectively associated drain and source regions;

an insulating film formed on and covering said word lines and said transverse sidewalls of each of said first and second contact holes and partially covering the surfaces of said respective drains and sources exposed through said respective first and second contact holes;

plural bit lines formed on said insulating film and extending in parallel relationship in the second direction, each said bit line being associated with a respective set of transistors aligned in said second direction and extending through the corresponding second contact holes and contacting the source regions, as exposed therethrough, of said respectively associated set of transistors; and plural storage capacitors respectively associated with said plural transistors, each storage capacitor comprising a storage electrode formed on said insulating film and spaced thereby from the associated word line and extending in correspondence with, and above, the associated transistor and adjacent field oxide film, means for electrically connecting said storage electrode, through the corresponding first contact hole, to the associated drain of the respective transistor, a dielectric film formed on said storage electrode, and an opposed electrode formed on and covering said dielectric film.

15. A dynamic random access memory device as claimed in claim 14, wherein each of said word lines is wider than either of said first and second contact holes.

16. A dynamic random access memory device as claimed in claim 14, wherein each of said storage capacitors is of almost the same width as each of said word lines.

17. A dynamic random access memory device as claimed in claim 14, wherein said insulating film includes respective reactive ion etched portions covering said sidewalls of each of said first and second contact holes.

18. A dynamic random access memory device as claimed in claim 14, wherein said electrically connecting means of each said storage capacitor comprises a self-aligned leader storage electrode formed on said insulating film and extending through said corresponding first contact hole and contacting the associated drain of the respective transistor, the associated storage electrode of said storage capacitor being electrically connected to said self-aligned leader storage electrode.

19. A dynamic random access memory device as claimed in claim 18, further comprising a second insulating film formed on said substrate and covering said bit lines and said self-aligned leader storage electrodes and having third contact holes therein respectively aligned with, and exposing a surface portion of, said self-aligned leader storage electrodes, said storage electrode of each said storage capacitor extending through said third contact hole and contacting said associated self-aligned leader storage electrode.

20. A dynamic random access memory device as claimed in claim 14, further comprising plural sense amplifiers, each for amplifying the potential difference between a pair of related bit lines respectively associated therewith, out of said plurality of bit lines, said plural sense amplifiers being disposed in successive positions, displaced in said first direction and aligned in said second direction with said respectively associated pair of bit lines.

21. A dynamic random access memory device as claimed in claim 14, wherein the distance between two adjacent, parallel bit lines is larger than the distance between two adjacent, parallel word lines.

22. A dynamic random access memory device as claimed in claim 14, wherein each said bit line is disposed between and respectively associated with a pair of first and second adjacent sets of plural transistors aligned in said second direction, the respective source regions of an alternating sequence of each said pair of first and second adjacent sets of plural transistors comprising portions of said respectively associated bit line disposed therebetween.

23. A dynamic random access memory device as claimed in claim 14, wherein each of said storage electrodes comprises a leader electrode portion in contact with said associated drain, and a storage electrode portion formed on and in contact with said leader portion.

* * * * *

UNITED STATES PATENT AND TRADEMARK OFFICE
CERTIFICATE OF CORRECTION

PATENT NO. :  5,025,294

DATED :  June 18, 1991

INVENTOR(S) :  Taiji EMA

It is certified that error appears in the above-identified patent and that said Letters Patent is hereby corrected as shown below:

```
Col. 1,   line 53, before "is" delete the blank spaces;
          line 68, change "large" to --larger--.

Col. 2,   line 23, change "provide" to --provides--.

Col. 3,   line 13, change "matches" to --match--;
          line 35, change "connect" to --contact--, and after "related"
(each occurrence) insert --a--;
          line 65, change "connect" to --contact--.

Col. 4,   line 26, change "connect" to --contact-- and after "with"
insert --a--;
          line 41, after "formed" insert --on--;
          line 60, change "connect" to --contact-- and after "with"
insert --a--.

Col. 7,   line 47, after "21" (first occurrence) insert --.--;
          line 62, after "and an" delete "r".

Col. 9,   line 48, change "81" (first occurrence) to --84--.

Col. 10,  line 26, delete "the" (first occurrence);
          line 52, change "electrode" to --electrodes--.

Col. 11,  line 5, after "112" insert --,--, and change "are also served"
to --also serve--;
          lines 46-47, change "is served" to --serves--.
```

UNITED STATES PATENT AND TRADEMARK OFFICE
CERTIFICATE OF CORRECTION

PATENT NO. : 5,025,294

DATED : June 18, 1991

INVENTOR(S) : Taiji EMA

It is certified that error appears in the above-identified patent and that said Letters Patent is hereby corrected as shown below:

```
Col. 12, line 15, after "of" insert --the--.

Col. 13, line 10, change "arrange" to --arranged--.

Col. 15, line 1, change "work" to --word--.
```

Signed and Sealed this

Thirteenth Day of July, 1993

Attest:

MICHAEL K. KIRK

Attesting Officer

Acting Commissioner of Patents and Trademarks